US010908479B2

(12) United States Patent
Suzuki (10) Patent No.: US 10,908,479 B2
(45) Date of Patent: Feb. 2, 2021

(54) VARIABLE IRIS DEVICE WITH SHAPE MEMORY ALLOY ELEMENT (71) Applicant: ACTUATOR SOLUTIONS GMBH, Gunzenhausen (DE)

(72) Inventor: Yusuke Suzuki, Yokohama (JP)

(73) Assignee: ACTUATOR SOLUTIONS GMBH, Gunzenhausen (DE)

(*) Notice: Subject to any disclaimer, the term of this patent is extended or adjusted under 35 U.S.C. 154(b) by 0 days.

(21) Appl. No.: 16/467,850

(22) PCT Filed: Dec. 6, 2018

(86) PCT No.: PCT/IB2018/059716
§ 371 (c)(1),
(2) Date: Jun. 7, 2019

(87) PCT Pub. No.: WO2019/116178
PCT Pub. Date: Jun. 20, 2019

(65) Prior Publication Data
US 2020/0319528 A1    Oct. 8, 2020

Related U.S. Application Data (60) Provisional application No. 62/598,226, filed on Dec. 13, 2017.

(51) Int. Cl.
G03B 9/08     (2006.01)
G03B 9/02     (2021.01)
H05K 3/36     (2006.01)
H04N 5/225    (2006.01)

(52) U.S. Cl.
CPC .............. G03B 9/08 (2013.01); G03B 9/02 (2013.01); H04N 5/2254 (2013.01); H05K 3/361 (2013.01); G03B 2205/0076 (2013.01)

(58) Field of Classification Search
CPC ...................................................... G03B 9/08
See application file for complete search history.

(56) References Cited

U.S. PATENT DOCUMENTS 3,883,885 A      5/1975  Orlando
2006/0239681 A1* 10/2006 Viglione ................ G03B 9/22
                                              396/535
2011/0314742 A1* 12/2011 Hsu ....................... G03B 9/36
                                              49/358

FOREIGN PATENT DOCUMENTS

JP    2005-134438 A    5/2005
WO    2010/058947 A2   5/2010

OTHER PUBLICATIONS

International Search Report (PCT/ISA/210) issued in PCT/IB2018/059716, dated Apr. 4, 2019.

(Continued)

Primary Examiner — Clayton E. LaBalle
Assistant Examiner — Dennis Hancock
(74) Attorney, Agent, or Firm — Birch, Stewart, Kolasch & Birch, LLP (57) ABSTRACT An aperture device actuated by a shape memory alloy wire controls two overlapping shuttering surfaces. The two shuttering surfaces control the amount of light transmitted through a lens assembly. The shape memory alloy wire is actuated by a flexible printed circuit which controls a lever slotted to both shuttering surfaces. By Joule heating, the electric current controls the shape of the wire, actuating the aperture device.

20 Claims, 7 Drawing Sheets (56) References Cited

OTHER PUBLICATIONS

Written Opinion of the International Searching Authority (PCT/ISA/237) issued in PCT/IB2018/059716, dated Apr. 4, 2019.

* cited by examiner

VARIABLE IRIS DEVICE WITH SHAPE MEMORY ALLOY ELEMENT

CROSS-REFERENCE TO RELATED APPLICATIONS

The present application claims priority to U.S. Prov. App. 62/598,226 filed on Dec. 13, 2017, which is incorporated herein by reference in its entirety.

TECHNICAL FIELD

The present disclosure relates to optical shutters. More particularly, it relates to a variable iris device with shape memory alloy element.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

SUMMARY

In a first aspect of the disclosure, an aperture device is described, the aperture device comprising: a first shuttering surface comprising a first opening and a first lateral slot; a second shuttering surface partially overlapping the first shuttering surface, the second shuttering surface comprising a second opening and a second lateral slot, the first and second opening forming an aperture; a lever comprising: a first pin inserted in the first lateral slot, a second pin inserted in the second lateral slot, a third pin configured to allow rotation of the lever between two end positions, a first end position corresponding to a fully opened state for the aperture, the second end position corresponding to an at least partially closed state for the aperture, a fourth pin having a reentrant slot; and a shape memory alloy wire slotted in the fourth pin.

Preferred aspects and embodiments of the disclosure are shown, for example, in the dependent claims of the present application.

DETAILED DESCRIPTION

The present disclosure describes an aperture system which can control the size of an aperture window. In some embodiments, the aperture system can control the degree of opening of the aperture window, between a fully closed position and a fully open position. For example, the aperture system may control the aperture so that it is open only partially, and may therefore be referred to as a variable iris device.

Figure 1:
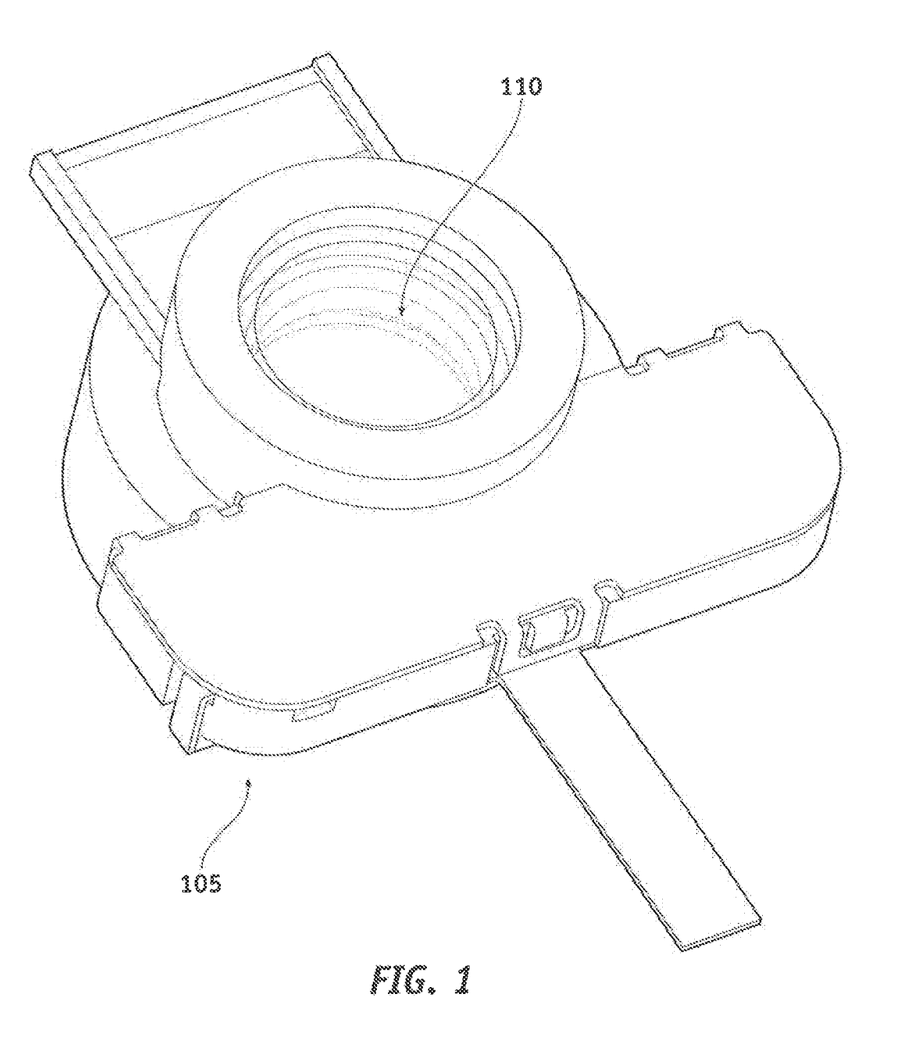
FIGS. 1-2 illustrate an exemplary front and back views of an aperture device integrated in a lens system.
Figure 2:
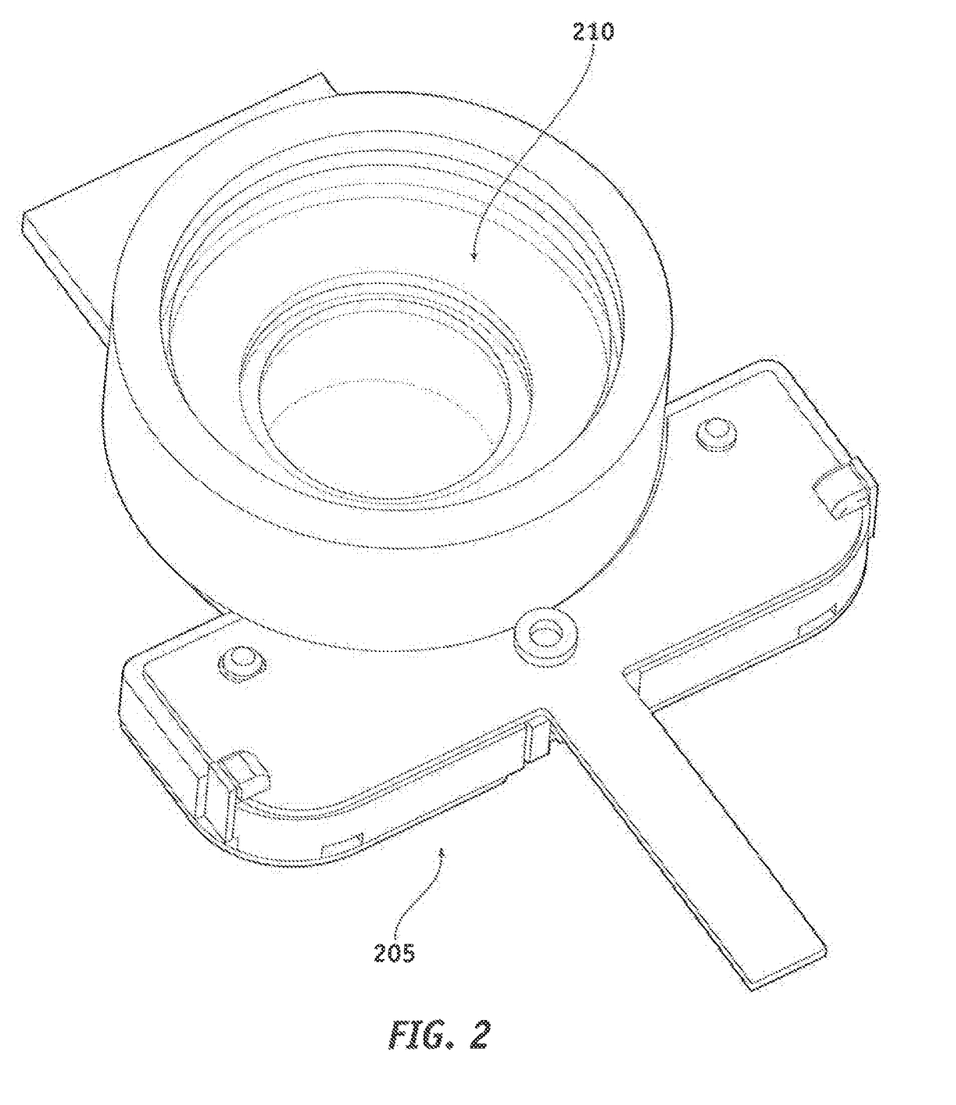

The aperture mechanism can be driven by a shape memory allow (SMA) wire and a torsion spring which can push against the SMA wire, generating a force. As known to the person of ordinary skill in the art, a shape-memory alloy is an alloy that has a physical "memory" of its original shape. The SMA wire can therefore deform and return to its original shape. FIG. 1 illustrates an exemplary front view of an aperture control device (105) integrated with a lens system (110). FIG. 2 illustrates an exemplary back view of an aperture control device (205) integrated with a lens system, for example a lens barrel (210). As known to the person of ordinary skill in the art, a lens system may comprise multiple lenses. Such lens system may be termed a lens barrel, and comprise different types of lenses. To control the amount of light passing through the lens barrel, a shutter can be inserted between two adjacent lenses which are part of the lens barrel. The present disclosure describes an aperture system based on a shape memory alloy wire, which implements a shutter mechanism within a lens barrel.

Figure 3:
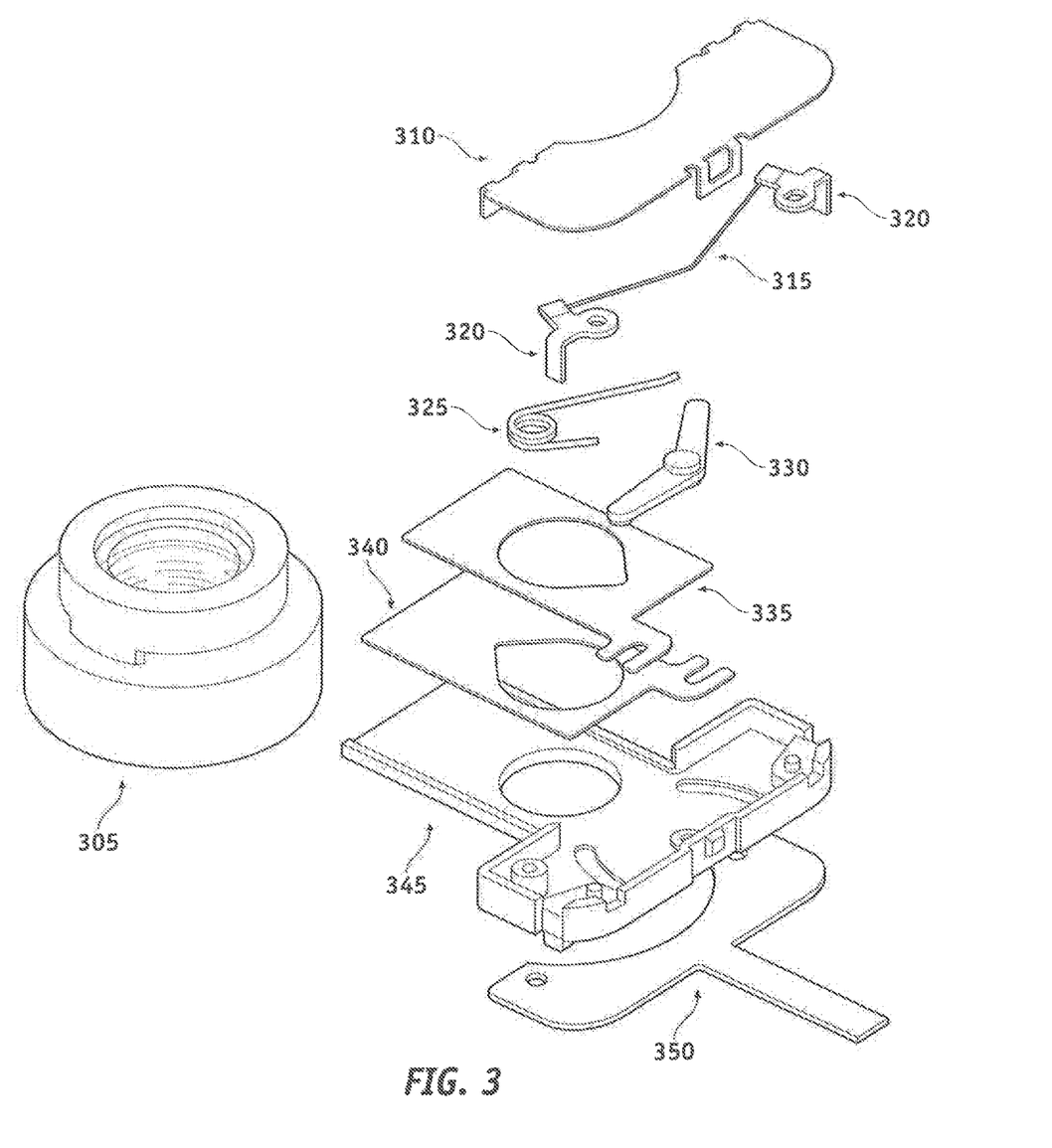
FIG. 3 illustrates an exemplary blowout view of an aperture device.

FIG. 3 illustrates an exemplary blowout view of an aperture device, comprising several components, and a lens barrel (305). The aperture mechanism may comprise: a cover (310) to protect the internal components from external damage; an SMA wire (315); two terminals or supporting elements (320), to which the SMA wire can be attached to for mechanical support and electrical connection. The SMA wire can actuate the two supporting elements (320) in order to actuate attached components, such as the shutter surfaces which can block light between lenses. A torsion spring (325) can provide an opposing force to the SMA wire in order to allow bidirectional control of the shutter, from closed to open and from open to closed. A lever element (330) moving between two positions can actuate on the shutter surfaces based on the SMA movement.

The shutter surfaces can also be termed blades due to their flat shape. In some embodiments, the shutter surfaces comprise a first flat element or shutter surface (335) and a second flat element or shutter surface (340). For example, these shutter surfaces, window surfaces, or aperture surfaces, can have an inner opening, for example shaped approximately like a teardrop, as visible in FIG. 3. The shutter surfaces may also have a lateral portion forming a U shape. This U-shaped groove, or slot, also shown in FIG. 3, accommodates one end of the lever (330). In this way, each of the two ends of the lever (330) is inserted in the corresponding slot of each shutter surface (335). When the SMA wire is actuated, the lever, and in turn, the two shutter surfaces through the U-shaped slots, move relative to each other. The amount of relative movement of the two blades (335) and (340) determines the degree of aperture of the shutter.

The shutter may also comprise a base housing (345) to house the components listed above, and a flexible printed circuit (FPC) as illustrated in FIG. 3 (350). In some embodiments, the FPC may be attached to the external surface of the housing (345) and provide electronic control of the shutter's operation, such as, for example, electric control of the SMA wire and window aperture. For example, the user may operate a digital control on a camera, which in turn could electronically control the shutter through the FPC.

Figure 4:
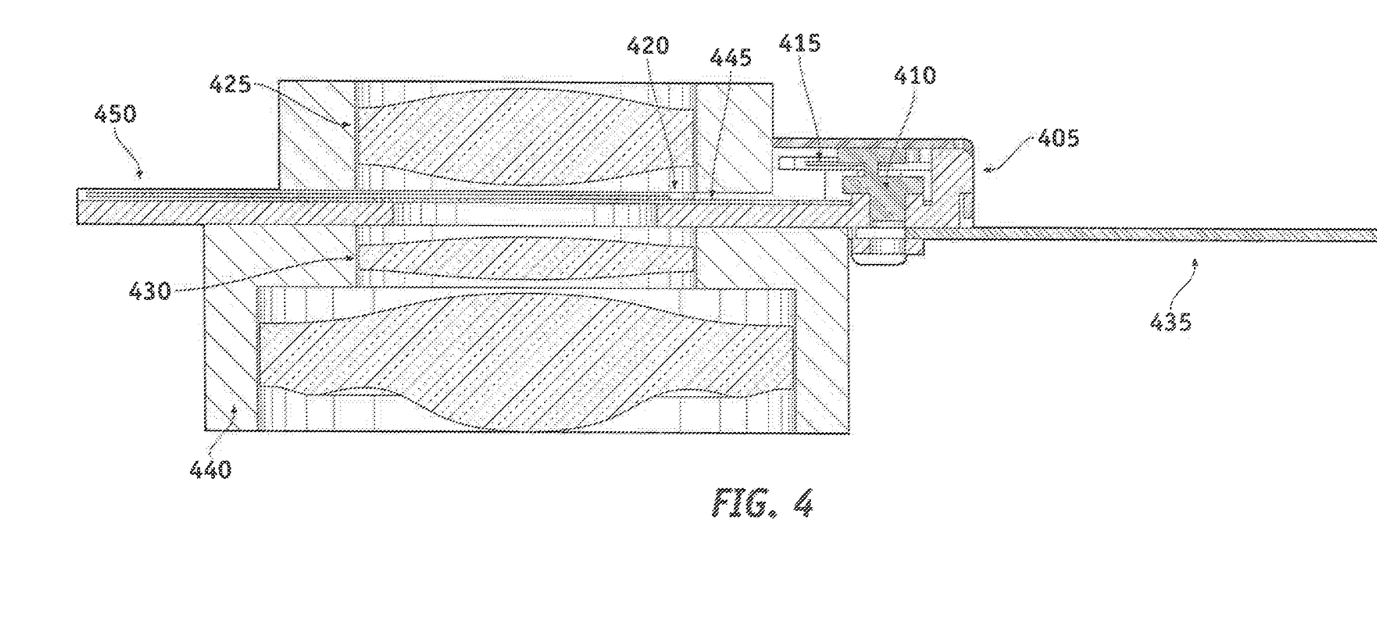
FIG. 4 illustrates a cross-sectional lateral view of an exemplary aperture device.

FIG. 4 illustrates a cross-sectional lateral view of an exemplary aperture device. The shutter blades (420) are placed between adjacent lenses (425) and (430). The FPC (435) can transmit control signals to the SMA wire (415), which can in turn actuate the lever (410) slotted within the slots of the shutter surfaces (420). The lens elements (425, 430) can be housed within a lens barrel (440). The shutter surfaces (420) can be distinguished in FIG. 4 with reference to FIG. 3. Blade (340) in FIG. 3 corresponds to (445) in FIG. 4, and blade (335) in FIG. 3 corresponds to (450) in FIG. 4.

As known to the person of ordinary skill in the art, an FPC comprises flexible electronics. Flexible electronics are electronic circuits assembled by mounting electronic devices on flexible plastic substrates, such as polyimide or transparent conductive polyester films. A flexible substrate may also be fabricated with other materials, such as, for example, polyether ether ketone (PEEK), a colorless organic thermoplastic polymer. Flex circuits can also comprise silver circuits screen printed on polyester. Flexible electronic assemblies may be manufactured using identical components used for rigid printed circuit boards, allowing the board to conform to a desired shape, or to flex during its use. An alternative approach to flexible electronics consists in various etching techniques to thin down a traditional silicon substrate to few tens of micrometers to gain reasonable flexibility. These processes are referred to as flexible silicon, and the flexible circuits made of silicon can have, for example, a bending radius of about 5 mm.

The FPC can be made with a photolithographic technology. A possible process comprises laminating very thin (e.g. 0.07 mm) copper strips in between two layers of polyethylene terephthalate (PET). These PET layers, e.g. 0.05 mm thick, can be coated with a thermosetting adhesive which is activated during the lamination process.

Figure 5:
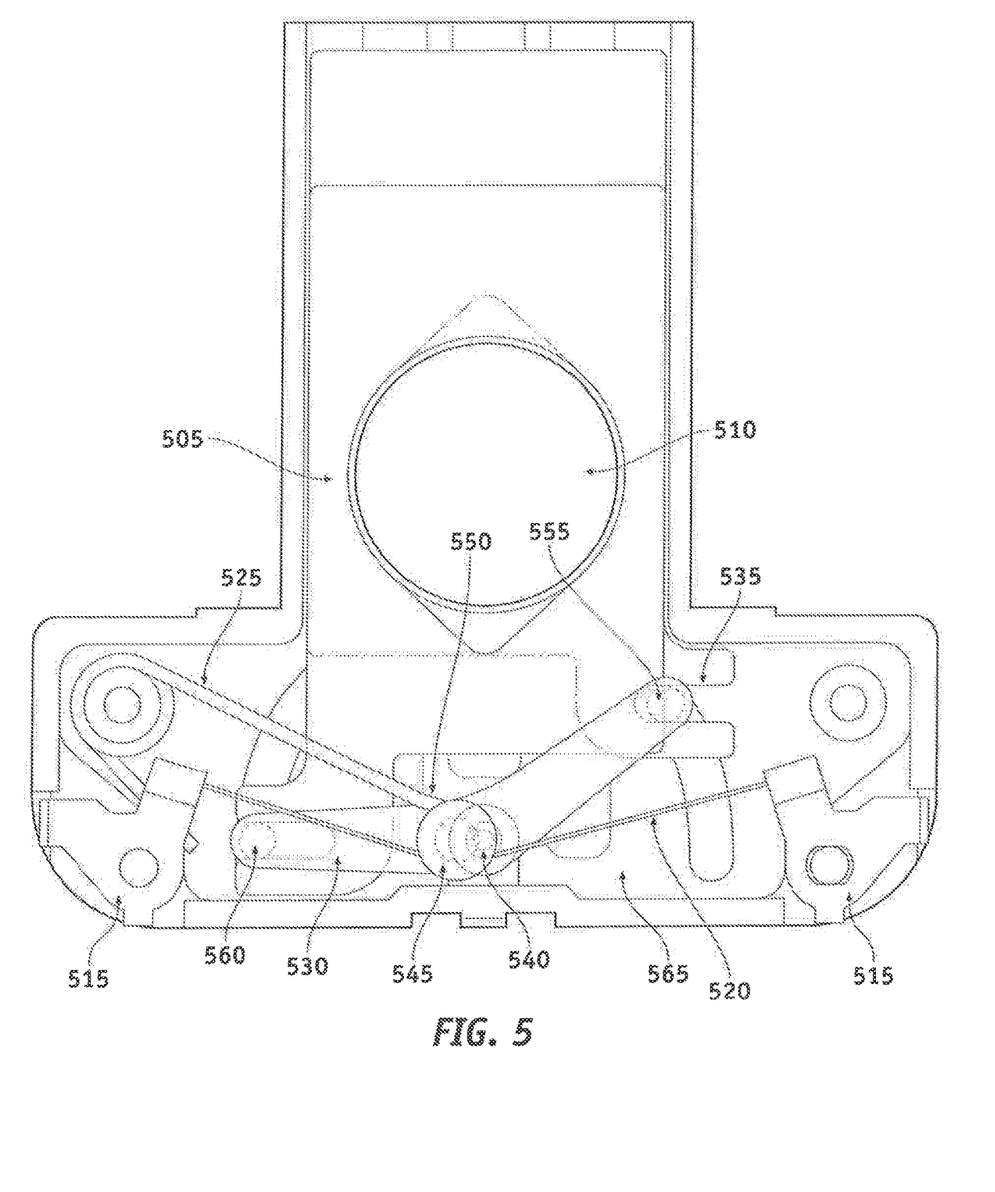
FIGS. 5 and 6 provide an internal view of the aperture mechanism in two different states of operation.
Figure 6:
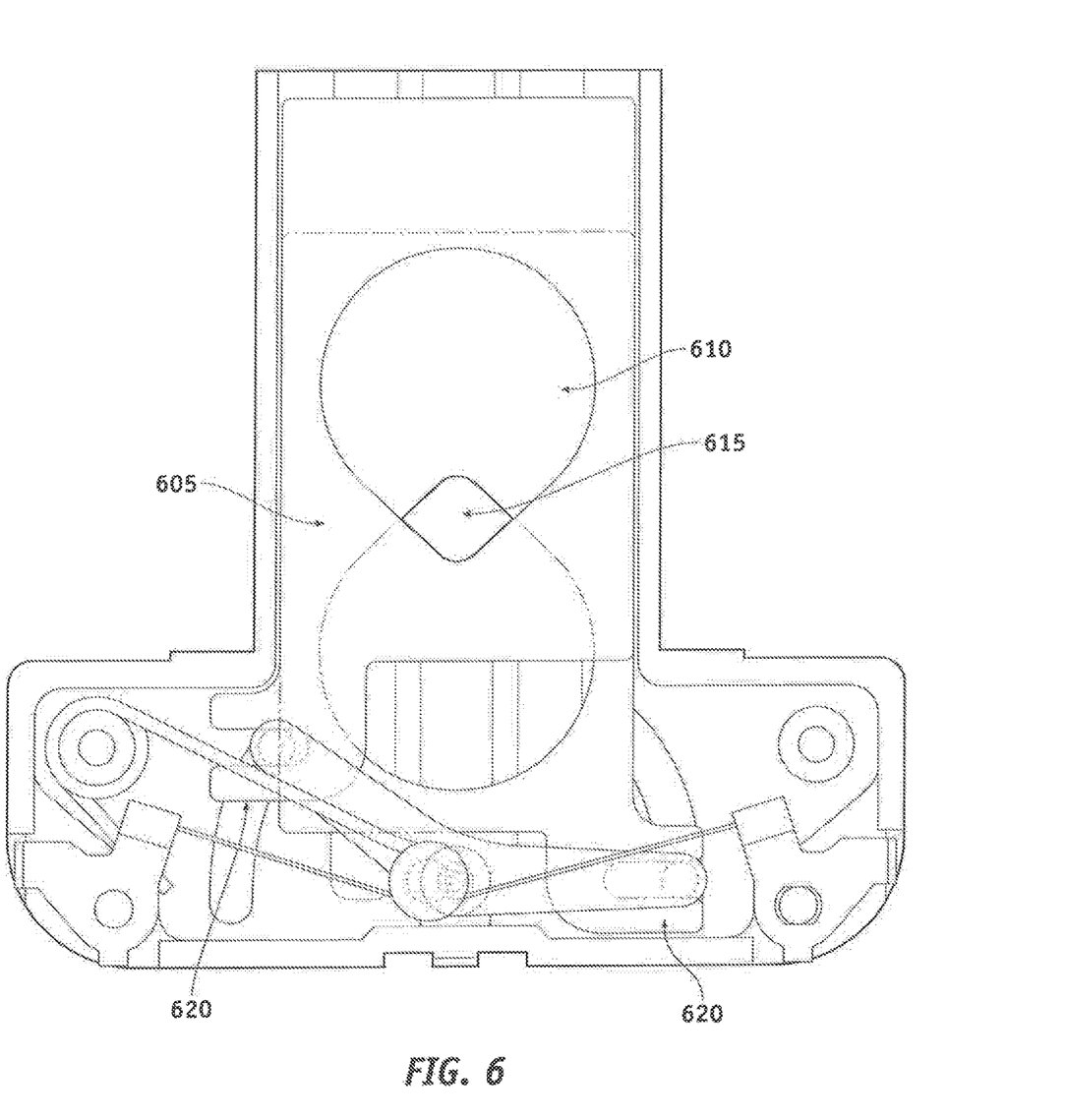

FIGS. 5 and 6 provide an internal view of the aperture mechanism in two different states of operation. In FIG. 5, the two shutter blades are aligned (505) so that the aperture is fully open (510). The SMA wire (520) is attached to the two supporting elements (515). The SMA wire can act on the lever (530) to actuate it between positions. The lever's two extremities can be slotted within the slots (535) of the shuttering blades. A torsion spring (525) provides a counteracting force to the SMA wire. For example, the spring can facilitate the return of the lever in the previous position, depending on the state of the SMA wire.

FIG. 6 shows a different state after the SMA wire has actuated the lever, which in turn actuates the shuttering blades. In FIG. 6, the two blades (605, 610) are aligned so that the aperture is closed, or partially closed (615).

In some embodiments, the mechanical elements are configured to be very thin in order to save space and fabricate a compact aperture mechanism. To fulfill this feature, in some embodiments there is no cover on top of the blade shutters. Instead, in these embodiments the lens barrel will perform the function of a cover to prevent the internal component from sliding out of position or out of the aperture mechanism.

The aperture window size (created by the blade shutters) can be controlled by the SMA wire through an electrical resistance feedback control. The SMA wire electrical resistance changes when its physical dimensions are modified, such as through a change of its diameter and length. The diameter and length will change while the SMA is pushing on or being pushed by the lever. The lever, in turn, pushes or pulls on the shuttering blades. Therefore, by controlling the SMA wire resistance, it is possible to control the window aperture size. In some embodiments, the aperture mechanism can be used as an iris for a mobile phone camera.

In FIG. 5, the two blades are hooked, through the respective slots, on the two pins (555, 560) at the extremities of the lever. Being moved by the lever, the two blades can have a symmetrical movement, which can be noted comparing FIGS. 5 and 6, as in one figure the blades' slots are up and down, and in the next figure are in the opposite, symmetrical position, down and up (620). The center aperture (510) of the two blades will create a window and control the light ray reaching the image sensor through the lenses.

The lever can comprise a pin (540) to rotate on the base (565). The lever can also comprise another pin on the opposite side of the rotation pin (the opposite side of the lever's surfaces). The second pin can be off-centered relative to the first pin, and can be a hook pin (545). The hook pin can hook onto the SMA wire, and will be pushed by the SMA when the current is applied. The other side of the hook pin can hook onto one side of the torsion spring (550). The torsion spring is generating a force in the opposite direction of the force generated by the SMA wire.

Figure 7:
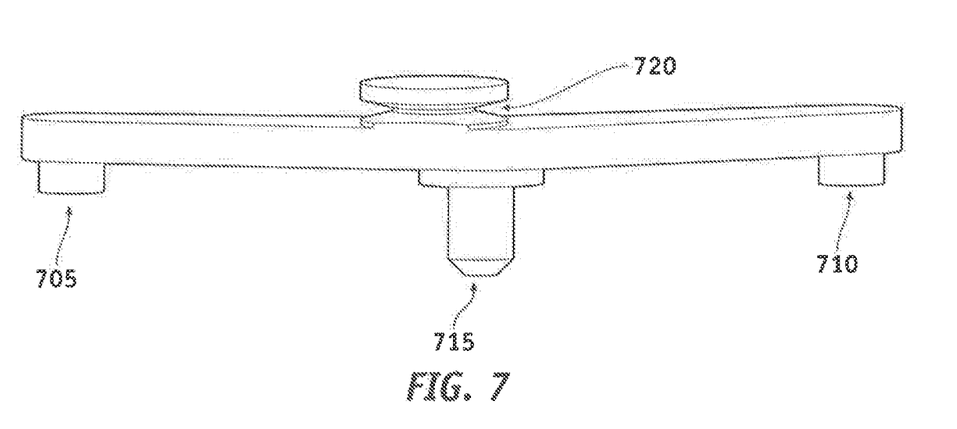
FIGS. 7 and 8 illustrates a view of a lens assembly and lever.
Figure 8:
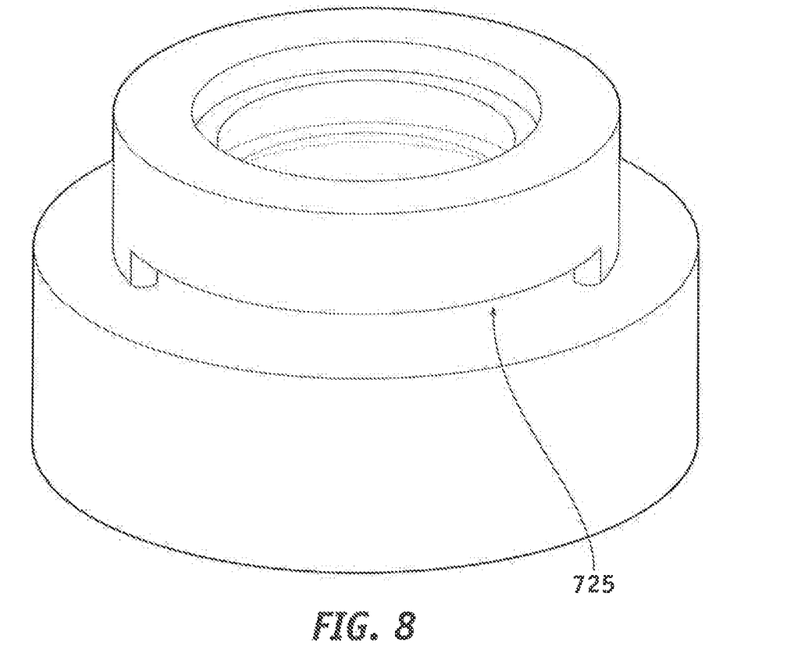

FIGS. 7 and 8 illustrate a view of a lens assembly and lever. The lever can comprise two pins at the two opposite ends (710, 705) corresponding to (555, 560); a pin (715) corresponding to (540) to allow rotation on the base; and a hook pin (720) corresponding to (545) to hook onto the SMA wire. As illustrated in FIG. 8, the lens barrel on the lens assembly can comprise a slot (725) to allow the iris device to be inserted partially within the lens assembly, as also illustrated in FIGS. 1-2.

The SMA wire may have, in some embodiments, a V shape, or a bent shape, or comprise a first straight portion and a second straight portion at an angle to the first straight portion between 90° and 180°, for example between 135° and 180°. The hook pin may have a reentrant slot into which the SMA wire can be slotted, or hooked. In some embodiments, the torsion spring has one end that slots in the hook pin of the lever. In some embodiments, the FPC is connected to the SMA wire to apply a current and actuate the shape memory alloy.

As known to the person of ordinary skill in the art, two common types of shape-memory alloys are copper-aluminum-nickel, and nickel-titanium alloys, but SMAs can also be fabricated by alloying zinc, copper, gold and iron, for example. The change in shape can be actuated with a difference in temperature. In some embodiments, the SMA wire can be fabricated with nickel-titanium as described in U.S. Pat. Nos. 8,152,941 9,315,880 and 8,430,981. The difference in temperature can be, in turn, caused by the application of current. SMA actuators are typically actuated electrically, with an electric current that causes Joule heating. Deactivation normally occurs by free convective heat transfer to the ambient environment.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The invention claimed is:

1. An aperture device comprising:
   a first shuttering surface (335) comprising a first opening and a first lateral slot;
   a second shuttering surface (340) partially overlapping the first shuttering surface, the second shuttering surface comprising a second opening and a second lateral slot, the first and second opening forming an aperture;
   a lever (330) comprising:
   a first pin (555) inserted in the first lateral slot,
   a second pin (560) inserted in the second lateral slot,
   a third pin (540) configured to allow rotation of the lever between two end positions, a first end position corresponding to a fully opened state for the aperture, the second end position corresponding to an at least partially closed state for the aperture, and
   a fourth pin (545) having a reentrant slot; and
   a shape memory alloy wire (315) slotted in the fourth pin.

2. The aperture device of claim 1, further comprising a lens assembly (305) comprising a plurality of lenses, wherein:
   the first shuttering surface and the second shuttering surface forming the aperture are inserted between adjacent lenses (425, 430) of the lens assembly,
   the fully opened state for the aperture corresponds to a first amount of light being transmitted through the lens assembly, and
   the at least partially closed state for the aperture corresponds to a second amount of light being transmitted through the lens assembly, the second amount of light being less than the first amount of light.

3. The aperture device of claim 2, wherein the lens assembly further comprises a lens assembly slot (725), configured to allow insertion of the first shuttering surface and the second shuttering surface.

4. The aperture device of claim 2, further comprising a torsion spring (325) comprising one end configured to exert an elastic force on the lever (330).

5. The aperture device of claim 2, further comprising a flexible printed circuit (350) connected to the shape memory alloy wire and configured to apply a current to the shape memory alloy wire to actuate the shape memory alloy wire, thereby rotating the lever between the two end positions.

6. The aperture device of claim 1, further comprising a torsion spring (325) comprising one end configured to exert an elastic force on the lever (330).

7. The aperture device of claim 6, further comprising a flexible printed circuit (350) connected to the shape memory alloy wire and configured to apply a current to the shape memory alloy wire to actuate the shape memory alloy wire, thereby rotating the lever between the two end positions.

8. The aperture device of claim 1, further comprising a flexible printed circuit (350) connected to the shape memory alloy wire and configured to apply a current to the shape memory alloy wire to actuate the shape memory alloy wire, thereby rotating the lever between the two end positions.

9. A digitally controlled camera, comprising the aperture device according to claim 8.

10. The aperture device of claim 1, wherein the at least partially closed state for the aperture is a fully closed state.

11. The aperture device of claim 1, wherein the shape memory alloy wire comprises a first straight portion and a second straight portion at an angle to the first straight portion between 90° and 180°.

12. The aperture device of claim 1, wherein the shape memory alloy wire comprises a first straight portion and a second straight portion at an angle to the first straight portion between 135° and 180°.

13. The aperture device of claim 1, wherein the shape memory alloy wire comprises a first end and a second end, the first end attached to a first supporting element (320) and the second end attached to a second supporting element (320).

14. The aperture device of claim 13, wherein the first supporting element and the second supporting element are actuatable by the shape memory alloy wire, the first supporting element and the second supporting element actuating in turn the first shuttering surface and the second shuttering surface for movement between the fully opened state for the aperture and the at least partially closed state for the aperture.

15. The aperture device of claim 1, wherein upon the rotation of the lever between the two end positions, the first shuttering surface and the second shuttering surface move between two corresponding shuttering positions, a first shuttering position corresponding to the fully opened state for the aperture, and the second shuttering position corresponding to the at least partially closed state for the aperture.

16. The aperture device of claim 15, wherein a first position (535) of the first lateral slot and the second lateral slot in the fully opened state for the aperture is symmetrical to a second position (620) of the first lateral slot and the second lateral slot in the at least partially closed state for the aperture.

17. The aperture device of claim 1, wherein the first shuttering surface and the second shuttering surface are flat surfaces.

18. The aperture device according to claim 1, wherein the first opening and the second opening are teardrop-shaped openings.

19. The aperture device of claim 1, wherein the first lateral slot and the second lateral slot are U-shaped slots.

20. The aperture device of claim 1, further comprising a cover (310) above the first shuttering surface, the second shuttering surface, the lever and the shape memory alloy wire.

\* \* \* \* \*